US005354714A

United States Patent [19]

Boysel

[11] Patent Number: 5,354,714

[45] Date of Patent: Oct. 11, 1994

[54] METHOD OF FORMING A VACUUM MICRO-CHAMBER FOR ENCAPSULATING A MICROELECTRONICS DEVICE

[75] Inventor: R. Mark Boysel, Plano, Tex.

[73] Assignee: Texas Instruments Incorporated, Dallas, Tex.

[21] Appl. No.: 112,828

[22] Filed: Aug. 26, 1993

Related U.S. Application Data

[60] Division of Ser. No. 994,441, Dec. 21, 1992, Pat. No. 5,270,574, which is a continuation of Ser. No. 739,267, Aug. 1, 1991, abandoned.

[51] Int. Cl.[5] .......... H01L 21/60

[52] U.S. Cl. .......... 437/209; 437/221; 437/223; 437/224

[58] Field of Search .......... 437/205, 214, 215, 216, 437/219, 21, 222, 223, 224, 65, 64

[56] References Cited

U.S. PATENT DOCUMENTS

| | | | |
|---|---|---|---|
| 4,213,104 | 7/1980 | Cullen et al. | 333/150 |
| 4,308,090 | 12/1981 | TeVelde et al. | 156/652 |
| 4,561,173 | 12/1985 | TeVelde | 437/65 |
| 4,701,424 | 10/1987 | Mikkor | 437/209 |
| 4,766,316 | 8/1988 | Jungkman | 357/83 |
| 4,973,378 | 11/1990 | Lee et al. | 156/633 |
| 4,983,878 | 1/1991 | Lee et al. | 313/308 |
| 5,063,327 | 11/1991 | Brodie et al. | 313/482 |
| 5,083,857 | 1/1992 | Hornbeck | 359/291 |

FOREIGN PATENT DOCUMENTS

WO91/03066 3/1991 PCT Int'l Appl. .

*Primary Examiner*—Tom Thomas
*Assistant Examiner*—Kevin M. Picardat
*Attorney, Agent, or Firm*—Brian C. McCormack; James C. Kesterson; Richard L. Donaldson

[57] ABSTRACT

A method of forming a vacuum micro-chamber for encapsulating a microelectronics device in a vacuum processing chamber comprises the steps of forming a microelectronics device (14) on a substrate base (30). The next step is to cover microelectronics device (14) with an organic spacer such as photoresist in a form having a plurality of protrusions, such as a star shape form (36). The next step is to cover the organic spacer and substrate base (30) with the metal layer (24) so that the metal layer covers all of the organic spacer except for a predetermined number of access apertures (34) to the organic spacer. Next, the organic spacer is removed through access apertures (34) to cause metal layer (24) to form a shell over a vacuum chamber (20) between the microelectronics device (14) and metal layer (24). The next step is to seal vacuum chamber (20) by coating metal layer (24) and closing off access apertures (34). The method of the present invention has application to produce vacuum micro-diodes and micro-triodes, micro-mass spectrometers, micro-light bulbs, and micro-thermocouple gages, as well as numerous other applications.

20 Claims, 2 Drawing Sheets

*FIG. 4*
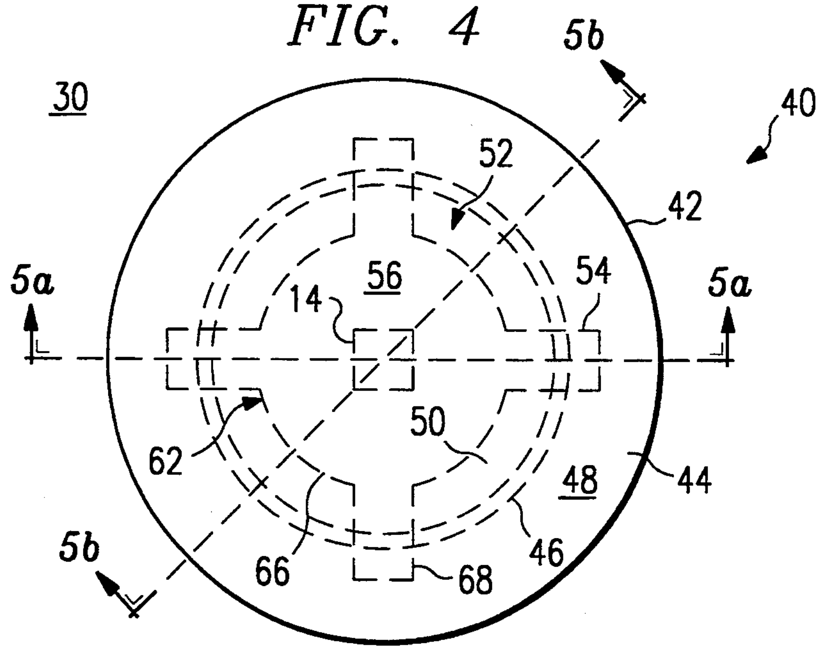
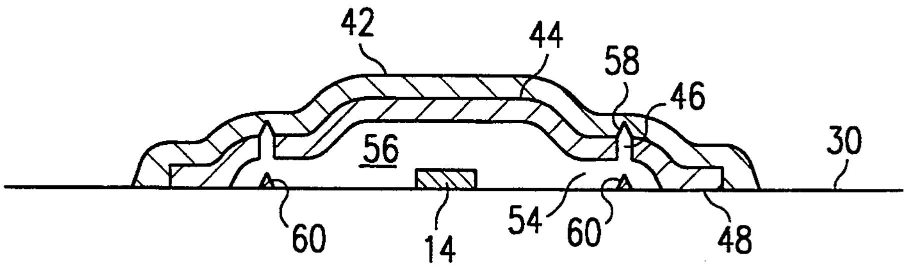
*FIG. 5a*
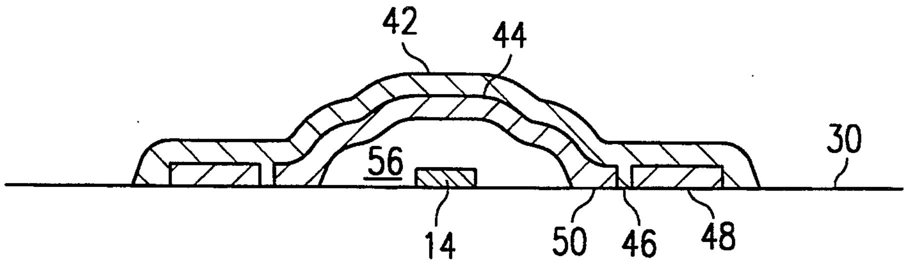
*FIG. 5b*

METHOD OF FORMING A VACUUM MICRO-CHAMBER FOR ENCAPSULATING A MICROELECTRONICS DEVICE

This is a divisional of application Ser. No. 07/994,441 filed Dec. 21, 1992, now U.S. Pat. No. 5,270,574 which is a continuation of application Ser. No. 07/739,267 filed Aug. 1, 1991 now abandoned.

TECHNICAL FIELD OF THE INVENTION

The present invention relates in general to microelectronics manufacturing techniques, and more particularly to a process of forming a vacuum micro-chamber for encapsulating a microelectronics device in a vacuum processing chamber and the product of the process.

BACKGROUND OF THE INVENTION

Recently, the advantages of modeling and fabricating microcavity integrated vacuum tubes are receiving increasing attention by designers of electronic systems. Microcavity integrated vacuum tubes are micrometer-sized devices that employ field emission instead of thermionic emission to generate charge carriers. These vacuum tubes operate as do the conventional vacuum tubes, but are fabricated on a silicon wafer in much the same way as are conventional integrated circuits.

Thin-film methods have been designed to create device layers and microlithography has been used to pattern various layers for these purposes. Conventional methods of producing micro-cavity integrated vacuum tubes, however, use a combination of oxides and refractory metals to form the microcavity structures. There are several problems associated with this approach.

First of all, these process techniques generally use some type of wet-etch process to carve or etch out a cavity within a semiconductor substrate. The wet-etch process is messy and, following the etching, a certain amount of residue is likely to remain. Secondly, during the process, oxide fills the cavity over which a high temperature refractory metal is placed. Once the refractory metal is in place, a wet-etch process is necessary to remove the oxide from within the cavity. Removing the oxide necessitates both a wet-etch technique and the use of refractory or high temperature metals. The wet-etch technique is necessary because of the chemical properties of the oxide. The high temperature or refractory metals are necessary to resist the corrosive effects of the wet-etch techniques. The result of this wet-etch technique often is a less than fully evacuated cavity within the substrate, a partly corroded refractory metal, and the potential of wet-etch residue within the cavity. As a result, less than optimal performance of the microcavity integrated vacuum tube can be expected using this technique.

If a process existed that could avoid the use of refractory metals, oxides for the cavity filling material, and the wet-etch techniques, a significantly improved vacuum micro-chamber would result. The benefits of having a clean vacuum chamber for the production of microcavity integrated vacuum tubes and other electronic devices may, then, be seen in many applications. These applications may include nuclear reactor instrumentation, fusion reactor instrumentation, accelerator instrumentation, bore hole seismic profiling, and space power systems. Additionally, high speed sensors, communication systems, and data processing systems would likely benefit from the high speed that vacuum chamber devices such as vacuum triodes or diodes on an integrated semiconductor substrate could achieve. Consequently, there are both the need for improved processing techniques and a variety of applications for these vacuum microelectronics devices.

In essence, there is a need for a method of producing a vacuum micro-chamber for encapsulating a microelectronics device that avoids the use of oxide as the micro-chamber spacer material.

There is the need for a method of producing a vacuum micro-chamber device that permits the use of lower temperature metals such as copper, aluminum, and their alloys and, thereby, takes advantage of their manufacturing properties.

There is a further need for a method of producing a vacuum micro-chamber for encapsulating a microelectronics device that fully avoids the use of wet-etch techniques that leave residues and may not fully evacuate the vacuum micro-chamber of the chamber spacer material.

SUMMARY OF THE INVENTION

Accordingly, the present invention provides a method of forming a vacuum micro-chamber that overcomes the limitations and satisfies the needs previously identified.

According to one aspect of the invention, there is provided a method of forming a vacuum micro-chamber for encapsulating a microelectronics device. Within a vacuum semiconductor device fabrication reactor, the method comprises the steps of first forming or placing the microelectronics device on a substrate base. Next, an organic spacer such as photoresist covers the microelectronics device. Then, a metal layer forms over the organic spacer and seals around the organic spacer at the substrate base so that the metal layer covers all of the organic spacer except a predetermined number of access apertures to the organic: spacer. The method then requires the removal of the organic spacer through the access apertures to form a vacuum chamber for the microelectronics device. As a result, the chamber interior has on one side the substrate base and the microelectronics device and on the other side the metal layer. The next step of the process is to seal the vacuum chamber by closing off the access apertures. Once the vacuum microelectronics device leaves the fabrication reactor, the seal causes the chamber to maintain the reactor vacuum.

As a result of the above method, a unique intermediate product of the present invention arises. The product comprises the substrate base which may include a silicon material and perhaps an insulating dielectric on which the microelectronics device appears. Over the microelectronics device is the organic spacer or photoresist and over the photoresist is the metal layer. The metal layer fully covers the photoresist and makes a seal around the photoresist except for the access apertures. At this point, an isotropic plasma etching process may be used to evacuate the chamber and a sealing metal may be placed over the metal layer to close off the access aperture and maintain the seal between the substrate base-microelectronics device portion and the metal layer portion.

A technical advantage of the present invention is that it requires no etching into the substrate base and thereby avoids this use of a wet-etch technique.

Another technical advantage of the present invention is that it uses a photoresist or organic spacer to create the volume for the vacuum chamber. This avoids first the wet-etch necessary to create the cavity within the semiconductor substrate and secondly avoids the need to use the wet-etch technique to remove the oxide that appears in conventional methods of forming the vacuum chamber. The isotropic plasma etching techniques do not leave a residue as do the anisotropic wet-etch techniques. The result is a much cleaner device than is possible with no microcavity formation methods.

Yet another technical advantage of the present invention is that because the method avoids wet-etch techniques, it is not necessary to use the high temperature or refractory metals of known techniques. As such it is possible to use low temperature metals such as copper, aluminum, and their alloys or to use a transparent dielectric. This adds a significant degree of freedom in the microelectronics device fabrication.

BRIEF DESCRIPTION OF THE DRAWINGS

The present invention, as well as its modes of use and preferred embodiment will best be understood with reference to the following detailed description of the preferred embodiment when taken in conjunction with the accompanying FIGUREs, wherein.

Figure 1:
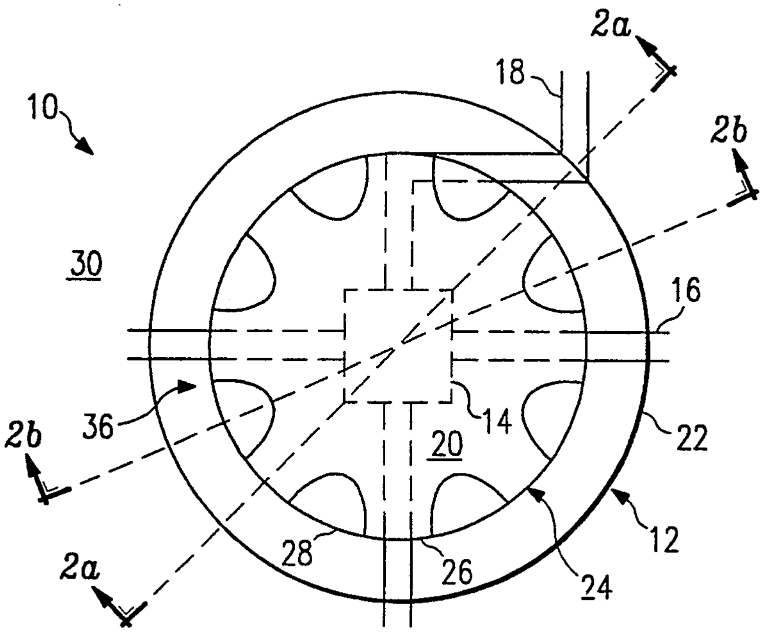
FIG. 1 is a top-down schematic view of a preferred embodiment of the micro-chamber according to the method of the present invention.
Figure 2A:
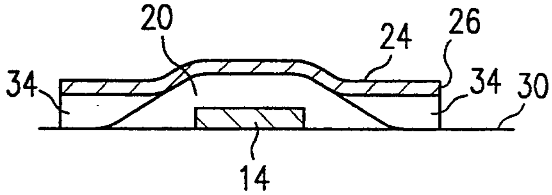
Figure 2B:
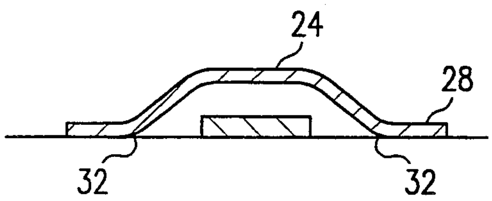
Figure 3A:
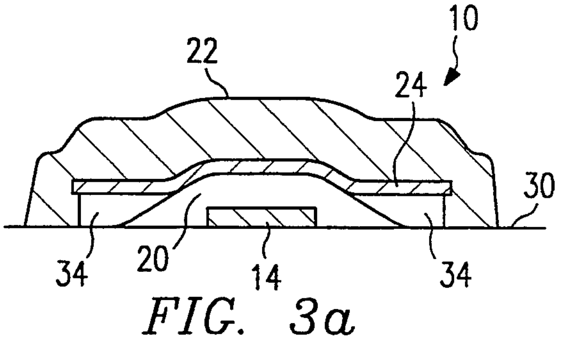
Figure 3B:
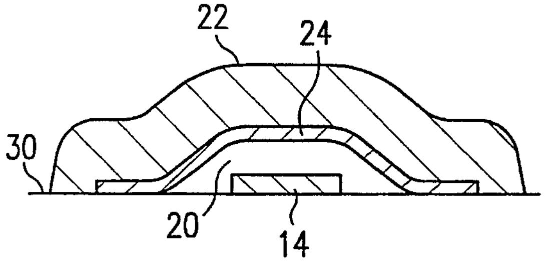

FIGS. *2a* and *2b* are side cross-sectional views of the device of FIG. 1 taken at the respective *2a* and *2b* slices shown of FIG. 1;

FIGS. *3a* and *3b* show the respective *2a* and *2b* cross-sectional views with sealing metal layers;

FIG. 4 illustrates a vacuum micro-chamber device formed according to a preferred embodiment of the method of the present invention; and FIGS. *5a* and *5b* illustrate side cross-sectional views of the device of FIG. 4 according to the respective *5a* and *5b* cross-sections indicated in FIG. 4.

DETAILED DESCRIPTION OF THE INVENTION

The preferred embodiment of the present invention is described below with reference to the accompanying FIGUREs, like numerals being used for like and corresponding parts of the various drawings, FIG. 1 shows the vacuum microelectronics device 10 of the process of the preferred embodiment of the present invention. According to FIG. 1, the vacuum device 10 and process of the preferred embodiment result in a vacuum chamber 12 covering microelectronics device 14. Microelectronics device 14 may attach to leads 16 and 18 according to its particular application. Vacuum microchamber 12 comprises space 20 which is sealed by sealing metal layer 20 and support metal layer 24. Support metal layer 24 has alternating raised portions 2*e* and lowered portions 28. Lowered portions 28 contact semiconductor substrate base 30. As a result, vacuum micro-chamber 12 establishes a vacuum within which microelectronics device 14 may operate as a vacuum triode or diode or other microelectronics device that advantageously uses a vacuum environment.

To better understand the configuration of FIG. 1, FIGS. *2a* and *2b* provide a cross-sectional view at the cross-section lines or slices *2a* and *2b* that appear in FIG. 1. According to FIG. *2a*, on substrate 30 appears vacuum microelectronics device 10 which includes metal layer 24 over vacuum chamber space 20. Vacuum chamber space 20 separates metal layer 24 from microelectronics device 14. FIG. *2b* shows the *2b* cross-section of FIG. 1. Of note in FIG. *2b* is the contact that metal layer 24 makes at points 32 to semiconductor substrate 30 to seal vacuum chamber space 20.

FIGS. *3a* and *3b* show the complete cross-section of FIG. 1 at respective slices *2a* and *2b*. And further include sealing metal 22 which closes off access apertures 34 of vacuum seal 20 to maintain a vacuum therewithin.

An important aspect of the present invention is the manner of making vacuum microelectronics device 10. With reference to FIGS. 1, *2a* and *2b*, and *3a* and *3b*, the following describes the process for forming the preferred embodiment of microelectronics device 10.

To begin the process, microelectronics device 14 together with leads 16 and 18 with appropriate electrical insulting dielectric may be formed on semiconductor substrate 30. The next step is to form a layer of organic spacer over microelectronics device 14 and leads 16 and 18. For the preferred embodiment, the organic spacer takes the star shaped form 36 in FIG. 1 that raised portions 26 and lowered portions 28 of metal layer 24 outline. Next, metal layer 24 is deposited over the organic spacer and contacts the region outside device 14 and the organic spacer. In FIG. 1 where the organic spacer had the protruding portions of the star shaped FIG. 36 the portions of the metal layer 24 that contact semiconductor substrate 30 are those arched in segments such as 28. Those portions of metal layer 24 that cover the protruding portions of star shaped FIG. 36 will form raised portions 26 and do not seal the photoresist at this stage in the process. The result is the configuration that FIGS. *2a* and *2b* illustrate.

FIG. *2a* shows that the raised portions of metal layer 26 provide an access aperture 34 into vacuum chamber space 20. On the other hand, FIG. *2b* shows that lowered portions 28 seal off vacuum chamber space 20. The next step in the process is to remove the photoresist from beneath metal layer 24. This may be done using an isotropic plasma etch as is done in the preferred embodiment. The result of this step is that metal layer 24 serves as a metal shell with access apertures 34 near the edges. Metal layer 24 is supported by the contact that it makes at lowered portions 28. The next step is to evacuate vacuum chamber 20. This occurs during the a metal deposition step which forms sealing metal 22 over metal layer 24 to close access apertures 34 as FIG. *3a* and *3b* illustrate.

The method of the present invention uses a method typical in deformable mirror device processing by including an organic spacer and an isotropic plasma etch for spacer removal. Since a low temperature plasma etch may be used for organic spacer removal in the preferred embodiment, the metal seal 22, as well as the metal layer 24, may function as the upper electrode of microelectronics device 14 to form a micro-triode or micro-diode, for example. For example, metal layer 24 may be aluminum, copper, or an alloy thereof. Alternatively, metal layer 24 may not be a metal at all but a transparent dielectric layer 24.

Particular advantages of the present invention are that using the isotropic etch, which is a dry process, permits a smaller access holes 34 which are easier to seal. Moreover, the dry isotropic plasma etch is a clean process that does not have the residue problems associated with wet-etch techniques. Furthermore, the method of the present invention is a low temperature process that is compatible with many process technologies. The processes with which the present invention may be compatible are gallium arsenide and metal oxide semiconductor processes.

The present invention may be used for a variety of products having a variety of applications. See for example the process described in U.S. patent application Ser. No. 07/739,268 entitled Method of Building a Microelectronics Triode or Diode. Additionally, the present invention may be used to form a micro-mass spectrometer, micro-light bulbs, or micro-thermocouple gages.

To more fully understand the present invention an alternative embodiment is provided in FIGS. 4, 5*a* and 5*b*. According to FIG. 4, there is shown on semiconductor substrate 30 microelectronics device 14 at the center of vacuum microelectronics device 40. The alternative embodiment device 40 comprises sealing metal layer 42 over metal layer 44 having access ring 46 to separate outer portion 48 from inner portion 50. Metal layer 44 covers vacuum chamber 52 having protrusions 54 and center volume 56. FIGS. 5*a* and 5*b* snow respective cross-sectional slices 5*a* and 5*b* of FIG. 4. In FIG. 5*a* sealing metal 42 covers metal layer 44 which surrounds vacuum chamber 52 including central portion 56 and protruding portion 54. Of particular interest in FIG. 5*a* is the cross-sectional view of access apertures 46 which may be either a complete circle surrounding inner portion 50 of metal layer 44 or may simply be a plurality of holes of a small diameter such as to the width that FIG. 5*a* shows. FIG. 5*a* also shows raised portion 58 of metal seal 42 which is formed when deposit 60 falls through access aperture 46 onto semiconductor substrate 30.

FIG. 5*b* shows the 5*b* slice or cross-section in FIG. 4. Since this cross-section does not include vacuum chamber 52 protrusions 54, metal layer 44 only covers central vacuum chamber portion 56. In the cross-section of FIG. 5*b*, both inner portion 50 and outer portion 48 of metal layer 44 contact semiconductor substrate 30. Consistently, access aperture 46 is not empty as in the FIG. 5*a* cross-section, but is filled with sealing metal layer 42.

The procedure for forming alternative embodiment 4*a* is similar to that of the preferred embodiment of FIG. 1. In essence, once microelectronics device 14 is ready for assembly into alternative embodiment vacuum microelectronics device 40, it is placed on semiconductor substrate 30. Thereafter, a layer of photoresist or other suitable organic spacer is formed in the cruciform pattern 62 having circular center 66. Then, metal layer 44 is deposited over photoresist pattern 62, but this time includes access apertures 46 which may either be a plurality of small access holes or a continuous ring that separates outer portion of metal layer 48 from inner portion 50. As FIG. 5*a* shows, a portion of access apertures 46 cover protrusions 58 of the photoresist cruciform pattern 62. The remainder of metal layer 44 seals around the circular center of pattern 62 to make a vacuum tight seal. The next step is to remove through access apertures 46 photoresist to form vacuum chamber 52 which, in the pattern of cruciform 62, contains center vacuum portion 56 and protrusions 54. Next, vacuum chamber 52 is evacuated and sealed within the vacuum of the fabrication reactor environment with sealing metal 42 to create a completely sealed vacuum chamber 52.

Noteworthy in alternative embodiment 40 of the present invention is that by virtue of a phenomenon characteristic of depositing a continuous metal layer over a plurality of access apertures such as 46. In this instance, a portion of metal layer 44 falls through access apertures 46 to deposit on semiconductor substrate 30 as points 60. As long as points 60, which contain conductive metal from sealing metal 42, do not contact either microelectronics device 14 or metal layer 44 this should not cause any problems in the design of vacuum microelectronics device 40.

The alternative embodiment 40 of FIG. 4 also includes the advantages and benefits of the preferred embodiment of FIG. 1.

Although the invention has been described with reference to the above specific embodiment, this description is not meant to be construed in a limiting sense. Various modifications of the disclosed embodiment as well as alternative embodiments of the invention will become apparent to persons skilled in the art upon reference to the above description. It is therefore contemplated that the appended claims will cover such modifications that fall within the true scope of the invention.

What is claimed is:

1. A method of forming a vacuum micro-chamber for encapsulating a microelectronic device on a substrate, said method comprising the steps of:

a) forming a spacer material overlying said microelectronic device and a portion of said substrate adjacent to said microelectronic device;

b) forming a covering layer overlying and encompassing said spacer material except for at least one access aperture;

c) removing said spacer material through said at least one access aperture to form a chamber defined between said substrate and said covering layer; and d) sealing said chamber by closing off said access aperture.

2. The method of claim 1 and further comprising the step of fixedly establishing a vacuum in said chamber by placing said chamber in an evacuated environment during said sealing step.

3. The method of claim 1 wherein said covering layer is a metal layer.

4. The method of claim 1 wherein said sealing step is accomplished by forming a metal seal over said access aperture.

5. The method of claim 1 wherein said metal layer is a low temperature metal layer.

6. The method of claim 1 wherein said metal layer is aluminum.

7. The method of claim 1 wherein said metal layer functions as the upper electrode of said microelectronic device to form a triode.

8. The method of claim 1 wherein said metal layer functions as the upper electrode of said microelectronic device to form a diode.

9. The method of claim 1 wherein said covering layer has a plurality of access apertures.

10. The method of claim 1 wherein said spacer material is an organic spacer.

11. The method of claim 1 wherein said spacer material is photoresist.

12. The method of claim 1 wherein said removing step is by isotropic plasma etching.

13. The method of claim 1 wherein said covering layer comprises lowered portions which are in contact with said substrate and a raised portion which is not in contact with said substrate, thereby forming said access aperture through said raised portion.

14. The method of claim 1 wherein said substrate is silicon.

15. The method of claim 1 wherein said substrate is gallium arsenide.

16. A method of forming a vacuum micro-chamber for encapsulating a microelectronic device on a substrate, said method comprising the steps of:

a) forming a spacer layer overlying said microelectronic device and said substrate;

b) patterning said spacer layer to form a spacer material overlying said microelectronic device and a portion of said substrate adjacent to said microelectronic device;

c) forming a metal layer overlying and encompassing said spacer material;

d) patterning said metal layer to form at least one access aperture therein;

e) removing said spacer material through said at least one access aperture by a isotropic plasma etch process to form a chamber defined between said substrate and said aluminum layer; and f) fixedly establishing a vacuum in said chamber by sealing said chamber in an evacuated environment with a metal seal over said access aperture.

17. The method of claim 16 wherein said dry etch process is an isotropic plasma etch.

18. The method of claim 16 wherein said metal layer is aluminum.

19. The method of claim 16 wherein said patterned metal layer comprises lowered portions which are in contact with said substrate and a raised portion which is not in contact with said substrate, thereby forming said access aperture through said raised portion.

20. A method of forming a vacuum micro-chamber for encapsulating a microelectronic device on a substrate, said method comprising the steps of:

a) forming a spacer layer of photoresist overlying said microelectronic device and said substrate;

b) patterning said spacer layer to form a spacer material overlying said microelectronic device and a portion of said substrate adjacent to said microelectronic device;

c) forming a metal layer overlying and encompassing said spacer material;

d) patterning said metal layer to form at least one access aperture therein;

e) removing said spacer material through said at least one access aperture by a dry etch process to form a chamber defined between said substrate and said metal layer; and f) fixedly establishing a vacuum in said chamber by sealing said chamber in an evacuated environment with a metal seal over said access aperture.

* * * * *